United States Patent
Chai

(10) Patent No.: US 6,914,850 B2
(45) Date of Patent: Jul. 5, 2005

(54) ADDRESS BUFFER HAVING (N/2) STAGES

(75) Inventor: Joon-wan Chai, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/668,140

(22) Filed: Sep. 22, 2003

(65) Prior Publication Data

US 2004/0160843 A1 Aug. 19, 2004

(30) Foreign Application Priority Data

Feb. 17, 2003 (KR) .................................. 10-2003-0009808

(51) Int. Cl.[7] ................................................. G11C 8/00
(52) U.S. Cl. .................................. 365/230.08; 365/233
(58) Field of Search ....................... 365/239.08, 189.05, 365/233, 189.08, 236, 230.08

(56) References Cited

U.S. PATENT DOCUMENTS 5,269,012 A * 12/1993 Nakajima .................... 711/200
6,711,084 B2 * 3/2004 Ishida et al. ................ 365/226

* cited by examiner

*Primary Examiner*—Thong Q. Le
(74) *Attorney, Agent, or Firm*—Marger Johnson & McCollom, P.C.

(57) ABSTRACT

An address buffer only having (N/2) stages, capable of performing the same function as that of an N-stage address buffer is provided. The address buffer used in a semiconductor device having N (where N is a natural number) additive latency comprises (N/2) serially-connected flip-flops, and an address control circuit which generates an address enable signal in response to a clock signal and a command signal. Each of the (N/2) flip-flops is clocked to the address enable signal and sequentially latches an external address.

13 Claims, 4 Drawing Sheets

ADDRESS BUFFER HAVING (N/2) STAGES

BACKGROUND OF THE INVENTION

This application claims the priority of Korean Patent Application No. 2003-9808, filed on Feb. 17, 2003, in the Korean Intellectual Property Office, the disclosure of which is incorporated herein in its entirety by reference.

1. Field of the Invention

The present invention relates to an address buffer used in a semiconductor device, and more particularly, to an address buffer only having (N/2) stages for processing N additive latency.

2. Description of the Related Art

In order to increase a bandwidth, high speed semiconductor memory device use a scheme for artificially delaying data during a data write operation or a data read operation. This structure is referred to as additive latency.

FIG. 1 is a timing diagram for explaining the concept of an additive latency. FIG. 2 is a circuit diagram of a conventional address buffer used in semiconductor devices having N additive latency. Referring to FIG. 2, N flip-flops 210_1, 210_2, ..., and 210_n are connected serial to one another, and each of the flip-flops 210_1, 210_2, ..., and 210_n sequentially latches an external address ADD in response to a clock signal CLK.

Referring to FIGS. 1 and 2, when a posted CAS read (PCR) command is input, reading of actual data in a high speed semiconductor memory device using additive latency is performed after additive latency (AL=2) and column address strobe (CAS) latency (CL=3). In this case, an address is delayed by total latency (RL=5) and output.

Thus, when there is N additive latency in a semiconductor device, an address buffer including N-stage flip-flops shown in FIG. 2 is needed. Each of the flip-flop 210_1, 210_2, ..., and 210_n stores an address of a PCR command that is consecutively input.

However, an interval DAL (delay address latency) between PCR commands of a general specification is over 2 clock cycle (2CK). Thus, there is no case where an address is stored in all stages of an address buffer 200. That is, when the maximum address is stored in the address buffer 200, only (N/2) stages are needed, and thus, the other N/2 stages are not needed.

However, when stages of the address buffer shown in FIG. 2 are reduced to (N/2), N additive latency cannot be secured. Thus, a circuit does not operate normally.

SUMMARY OF THE INVENTION

The present invention provides an address buffer only having (N/2) stages, capable of performing the same function as that of an N-stage address buffer.

According to one aspect of the present invention, there is provided an address buffer used in a semiconductor device having N (where N is a natural number) additive latency. The address buffer includes (N/2) serially-connected flip-flops, and an address control circuit which generates an address enable signal in response to a clock signal and a command signal. Each of the (N/2) flip-flops is clocked to the address enable signal and sequentially latches an external address.

The address control circuit includes an N-bit counter which responds to the clock signal, an AND gate which receives output signals of the N-bit counter and performs an AND operation on the output signals of the N-bit counter, and an OR gate which receives the command signal and an output signal of the AND gate, performs an OR operation on the command signal and the output signal of the AND gate, and outputs the address enable signal as an OR operation result.

According to another aspect of the present invention, there is provided an address buffer used in a semiconductor device having N additive latency. The address buffer includes an N-bit counter which responds a clock signal, an AND gate which receives output signals of the N-bit counter and performs an AND operation on the output signals of the N-bit counter, an OR gate which receives the command signal and an output signal of the AND gate and performs an OR operation on the command signal and the output signal of the AND gate, and (N/2) serially-connected flip-flops. Each of the (N/2) flip-flops is clocked to the output signal of the AND gate and latches and outputs an external address.

The N-bit counter is reset in response to the command signal, and the command signal is activated in response to a data write command or a data read command.

BRIEF DESCRIPTION OF THE DRAWINGS

The above and other aspects and advantages of the present invention will become more apparent by describing in detail a preferred embodiment thereof with reference to the attached drawings in which.

DETAILED DESCRIPTION OF THE INVENTION

Figure 1:
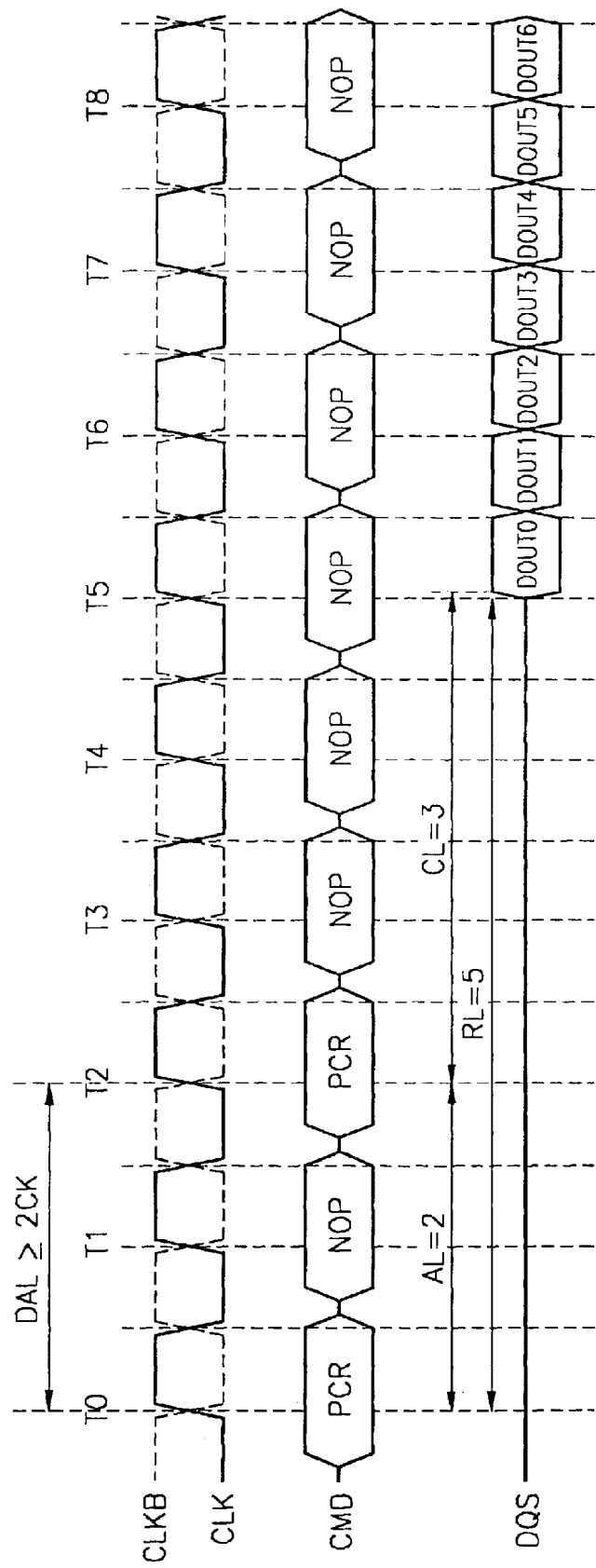
FIG. 1 is a timing diagram for explaining the concept of an additive latency.
Figure 2:
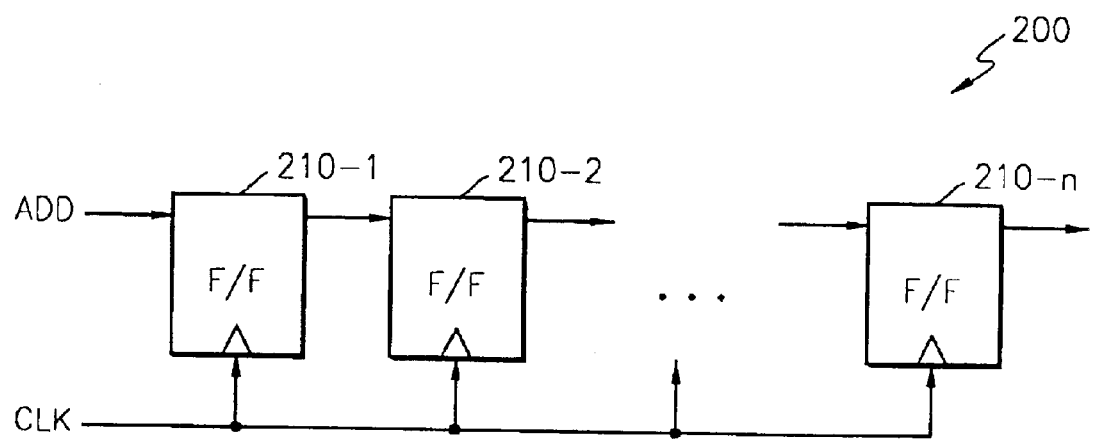
FIG. 2 is a circuit diagram of a conventional address buffer used in semiconductor devices having N additive latency.

The present invention will be described more fully hereinafter with reference to the accompanying drawings in which a preferred embodiment of the invention are shown.

Hereinafter, the present invention will be described in detail by describing preferred embodiments of the invention with reference to the accompanying drawings. Like reference numerals refer to like elements throughout the drawings.

Figure 3:
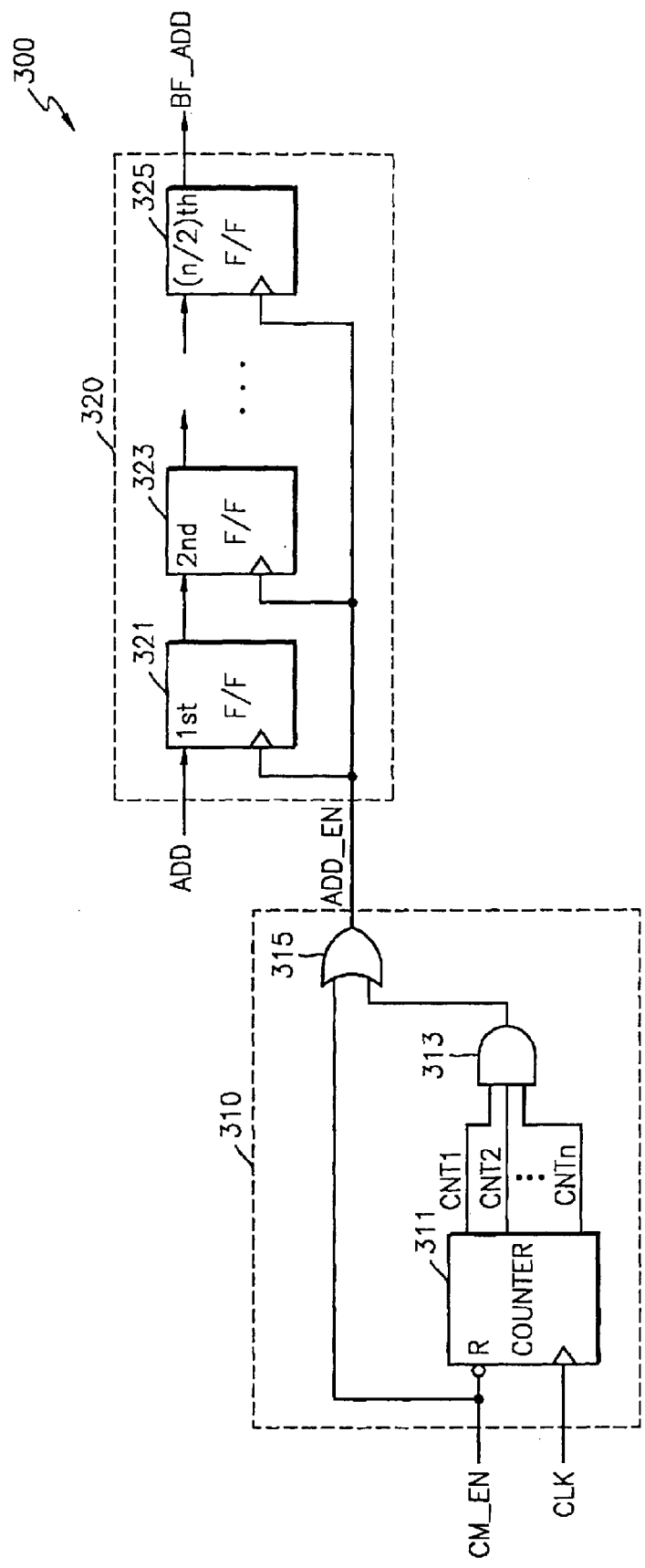
FIG. 3 is a block diagram of an address buffer used in a semiconductor device having N additive latency according to an embodiment of the present invention.

FIG. 3 is a block diagram of an address buffer used in a semiconductor device having N additive latency according to an embodiment of the present invention. Referring to FIG. 3, an address buffer 300 used in a semiconductor device having N additive latency includes an address control circuit 310 and a shifting circuit 320.

The address control circuit 310 includes an N-bit counter 311, an AND gate 313, and an OR gate 315. The N-bit counter 311 is clocked to a clock signal CLK and outputs N-bit count values CNT1, CNT2, ..., and CNTn to the AND gate 313. The N-bit counter 311 is reset in response to a falling edge of a command signal CM_EN. Here, the command signal CM_EN is activated when a write command or a read command is input.

The AND gate 313 receives output signals CNT1, CNT2, ..., and CNTn of the N-bit counter 311, performs an AND operation on the output signals CNT1, CNT2, . . . , and CNTn, and outputs an AND operation result to the OR gate 315.

The OR gate 315 receives the command signal CM_EN and an output signal of the AND gate 313, performs an OR operation on the command signal CM_EN and the output signal of the AND gate 313, and outputs an OR operation result ADD_EN as an address enable signal to the shifting circuit 320.

The shifting circuit 320 includes a plurality of serially-connected flip-flops 321, 323, . . . , and 325. The flip-flop 321 of a first stage latches an address ADD in response to the address enable signal ADD_EN, and the flip-flop 323 of a second stage latches an output signal of the flip-flop 321 in response to the address enable signal ADD_EN.

The flip-flop 325 of a (N/2)-th stage outputs an output signal of a flip-flop (not shown) of a ((N/2)-1)-th stage as a buffered address signal BF_ADD in response to the address enable signal ADD_EN.

That is, each of serially-connected (N/2) flip-flops 321, 323, . . . , and 325 sequentially shifts an externally-input address ADD whenever the address enable signal ADD_EN is activated. Here, each flip-flop is also called a stage.

Figure 4:
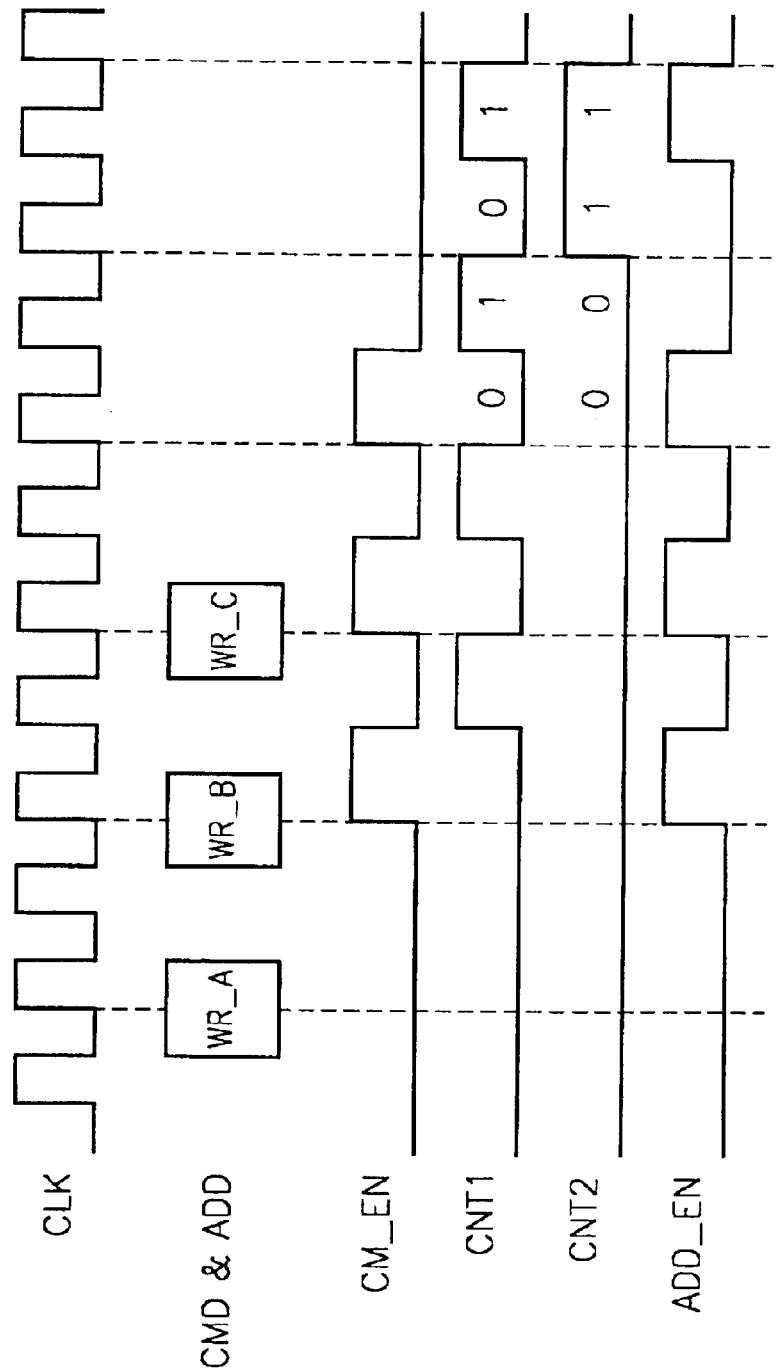
FIG. 4 is a timing diagram of an address control circuit shown in FIG. 3.

FIG. 4 is a timing diagram of an address control circuit shown in FIG. 3. FIG. 4 shows the case where additive latency is 2, N=2. However, the address buffer according to the present invention is not limited to the case where additive latency is 2.

Referring to FIGS. 3 and 4, in CMD & ADD, WR_A denotes a write command WR and an address A, and WR_B denotes a write command WR and an address B, and W_C denotes a write command WR and an address C.

The case where the N-bit counter 311 is a 2-bit counter and three write commands WR_A, WR_B, and WR_C are consecutively input will be described as below.

The 2-bit counter 311 is reset and operates in response to WR_A. Thus, when an output signal of the 2-bit counter 311 is 11, the output signal ADD_EN of the OR gate 315 is activated. Thus, the flip-flop 321 of the first stage latches the external address ADD in response to the activated address enable signal ADD_EN.

When the command signal CM_EN is deactivated (for example, logic low) and the output signal of the 2-bit counter 311 is 10, the output signal of the AND gate 313 is deactivated. Thus, the output signal ADD_EN of the OR gate 315 is deactivated.

An operation which corresponds when WR_B is input is substantially the same as an operation which corresponds when WR_A is input, and thus, detailed descriptions thereof will be omitted.

When WR_C is input, the 2-bit counter 311 outputs counter values CNT1 and CNT2 in response to a falling edge of the clock signal CLK. The OR gate 315 outputs the address enable signal ADD_EN generated by a combination of the command signal CM_EN and the output signal of the AND gate 313, to each of the flip-flops 321, 323, . . . , and 325. That is, the AND gate 313 and the OR gate 315 receive the output signals CNT1, CNT2, . . . , and CNTn of the counter 311, decode them, and activate the address enable signal ADD_EN at a point-in-time when an effective address is input.

Thus, the address enable signal ADD_EN is activated only at the point-in-time when the effective address is input. Thus, the number of flip-flops used in the shifting circuit 320 can be reduced. Thus, the area of layout of the address buffer is reduced.

As described above, the address buffer used in a semiconductor device having N additive latency according to the present invention can perform the same function as that of an N-stage address buffer by providing only (N/2) stages. That is, an N-stage buffer can be reduced to an (N/2)-stage buffer.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An address buffer used in a semiconductor device having N additive latency, where N is a natural number, the address buffer comprising:

(N/2) serially-connected flip-flops; and an address control circuit which generates an address enable signal in response to a clock signal and a command signal;

wherein each of the (N/2) flip-flops is clocked to the address enable signal and sequentially latches an external address.

2. The address buffer of claim 1, wherein the address control circuit comprises:

an N-bit counter which responds to the clock signal;

an AND gate which receives output signals of the N-bit counter and performs an AND operation on the output signals of the N-bit counter; and an OR gate which receives the command signal and an output signal of the AND gate, performs an OR operation on the command signal and the output signal of the AND gate, and outputs the address enable signal as an OR operation result.

3. The address buffer of claim 2, wherein the N-bit counter is reset in response to the command signal.

4. The address buffer of claim 1, wherein the command signal is activated in response to a data write command or a data read command.

5. An address buffer used in a semiconductor device having N additive latency, the address buffer comprising:

an N-bit counter which responds a clock signal;

an AND gate which receives output signals of the N-bit counter and performs an AND operation on the output signals of the N-bit counter;

an OR gate which receives the command signal and an output signal of the AND gate and performs an OR operation on the command signal and the output signal of the AND gate; and (N/2) serially-connected flip-flops;

wherein each of the (N/2) flip-flops is clocked to the output signal of the AND gate and latches and outputs an external address.

6. The address buffer of claim 5, wherein the N-bit counter is reset in response to the command signal.

7. The address buffer of claim 5, wherein the command signal is activated in response to a data write command or a data read command.

8. An address buffer used in a semiconductor device having N additive latency where N is a natural number, the address buffer comprising:

a shifting circuit including N/2 flip-flops;

an address control circuit which generates an address enable signal in response to a clock signal and a command signal;

wherein each of the (N/2) flip-flops is clocked to the address enable signal and sequentially latches an external address.

9. The address buffer of claim 8, wherein the address control circuit comprises:

an N-bit counter which responds to the clock signal;

an AND gate which receives output signals of the N-bit counter and performs an AND operation on the output signals of the N-bit counter; and an OR gate which receives the command signal and an output signal of the AND gate, performs an OR operation on the command signal and the output signal of the AND gate, and outputs the address enable signal as an OR operation result.

10. The address buffer of claim 8, wherein the N-bit counter is reset in response to the command signal.

11. The address buffer of claim 8, wherein the command signal is activated in response to a data write command or a data read command.

12. An address buffer used in a semiconductor device having N additive latency, where N is a natural number, the address buffer comprising:

(N/2) serially-connected flip-flop; and an address control circuit which generates an address enable signal in response to a clock signal and a command signal, wherein the address control circuit comprises:

an N-bit counter which responds to the clock signal, an AND gate which receives output signals of the N-bit counter and performs an AND operation on the output signals of the N-bit counter, and an OR gate which receives the command signal and an output signal of the AND gate, performs an OR operation on the command signal and the output signal of the AND gate, and outputs the address enable signal as an OR operation result, and wherein each of the (N/2) flip-flops is clocked to the address enable signal and sequentially latches an external address.

13. The address buffer of claim 12, wherein the N-bit counter is reset in response to the command signal.

* * * * *